(12) United States Patent
Massoubre

(10) Patent No.: US 10,790,408 B1
(45) Date of Patent: Sep. 29, 2020

(54) WAFER BONDING FOR LASER LIFT-OFF

(71) Applicant: Facebook Technologies, LLC, Menlo Park, CA (US)

(72) Inventor: David Massoubre, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 10 days.

(21) Appl. No.: 16/362,535

(22) Filed: Mar. 22, 2019

Related U.S. Application Data

(60) Provisional application No. 62/650,893, filed on Mar. 30, 2018.

(51) Int. Cl.
| | |
|---|---|
| *H01L 33/06* | (2010.01) |
| *H01L 33/10* | (2010.01) |
| *H01L 33/00* | (2010.01) |
| *H01L 33/40* | (2010.01) |
| *H01L 33/24* | (2010.01) |
| *H01L 25/075* | (2006.01) |
| *H01L 33/30* | (2010.01) |
| *H01L 33/32* | (2010.01) |

(52) U.S. Cl.
CPC ...... *H01L 33/0093* (2020.05); *H01L 25/0753* (2013.01); *H01L 33/007* (2013.01); *H01L 33/0066* (2013.01); *H01L 33/0075* (2013.01); *H01L 33/24* (2013.01); *H01L 33/30* (2013.01); *H01L 33/32* (2013.01); *H01L 33/405* (2013.01); *H01L 33/06* (2013.01); *H01L 2933/0016* (2013.01)

(58) Field of Classification Search
None
See application file for complete search history.

(56) References Cited

U.S. PATENT DOCUMENTS 10,483,430 B1 * 11/2019 Lutgen .................. H01L 33/20

* cited by examiner

*Primary Examiner* — Robert K Carpenter
(74) *Attorney, Agent, or Firm* — Fenwick & West LLP

(57) ABSTRACT

A micro-light emitting diode (LED) is manufactured using a lift-off substrate that is removed using a laser-lift-off process. A method for manufacturing the LED may include forming an epitaxial structure of the LED on a growth substrate, and attaching an open side of the epitaxial structure with a gallium-based layer and a lift-off substrate, the gallium-based layer between the epitaxial structure and the lift-off substrate. The growth substrate is separated from the epitaxial structure, and the epitaxial structure may be processed into the LED. Light is applied to the gallium-based layer through the lift-off substrate to debond the second portion of the gallium-based layer and the lift-off substrate. The lift-off substrate is separated from the second portion of the gallium-based layer to expose a light emitting surface of the LED on the second portion of the gallium-based layer.

13 Claims, 11 Drawing Sheets

200

---

Form an epitaxial structure of a light emitting diode (LED) on a growth substrate with a first side of the epitaxial structure facing the growth substrate
205

↓

Attach a second side of the epitaxial structure with a gallium-based layer and a lift-off substrate
210

↓

Separate the growth substrate from first side of the epitaxial structure
215

↓

Etch the epitaxial structure from the first side to form a mesa and a base
220

↓

Form a dielectric layer and a p-contact on the mesa and an n-contact on the base
225

↓

Attach the first side of the epitaxial structure including the p-contact and the n-contact with a carrier substrate
230

↓

Apply light to the gallium-based layer to form a gallium material between the gallium-based layer and the lift-off substrate
235

↓

Heat the gallium material to debond the gallium-based layer and the lift-off substrate
240

↓

Separate the lift-off substrate from the gallium-based layer
245

↓

Pick up the LED from the carrier substrate and place the LED on a target substrate
250

FIG. 2

WAFER BONDING FOR LASER LIFT-OFF

CROSS REFERENCE TO RELATED APPLICATION

This application claims the benefit of U.S. Provisional Patent Application No. 62/650,893, filed Mar. 30, 2018, which is incorporated by reference in its entirety.

BACKGROUND

Laser Lift-Off (LLO) has been used to remove transparent growth substrates from epitaxial structures grown on the transparent growth substrates. For example, a gallium nitride (GaN)-based epitaxial structure can be separated from a sapphire growth substrate by applying a laser light through the transparent substrate to melt the GaN at the interface of the GaN epitaxial structure and the sapphire growth substrate. However, LLO is not compatible with processes that use non-transparent substrates for the laser light, such as GaAs substrates for GaAs-based epitaxial structure. It is desirable to use LLO for substrate removal to improve front-end and back-end manufacturing, such as in the manufacturing of micro-light emitting diodes.

SUMMARY

Embodiments relate to manufacturing a light emitting diode (LED) by forming an epitaxial structure of the LED on a growth substrate, where a first side of the epitaxial structure faces the growth substrate. A second side of the epitaxial structure is attached with a gallium-based (e.g., gallium nitride (GaN)) layer and a lift-off substrate, the gallium-based layer between the epitaxial structure and the lift-off substrate. The growth substrate is separated from the epitaxial structure, and the epitaxial structure may be processed into the LED, and the lift-off substrate may be removed. To remove the lift-off substrate, (e.g., ultraviolet) light is applied to the gallium-based layer through the lift-off substrate to form a gallium material from a first portion of the gallium-based layer, the gallium material between a second portion of the gallium-based layer and the lift-off substrate. The gallium material is heated to debond the second portion of the gallium-based layer and the lift-off substrate. The lift-off substrate is separated from the second portion of the gallium-based layer to expose a light emitting surface of the LED on the second portion of the gallium-based layer Some embodiments relate to manufacturing an electronic display by placing the LED including the epitaxial structure and the second portion of the gallium-based layer on a display substrate of the electronic display.

Some embodiments relate to a LED, including an epitaxial structure including a mesa and a base, the mesa having a top defined at a first side of the epitaxial structure and including an active layer to emit light. The base has a light emitting surface defined at a second side of the epitaxial structure opposite the first side. A portion of the light emitted from the active layer is reflected at the top of the mesa and directed toward the light emitting surface. The LED further includes a gallium-based (e.g., gallium nitride (GaN)) layer facing the light emitting surface of the epitaxial structure, and a bonding layer between the light emitting surface of the epitaxial structure and the gallium-based layer. The bonding layer attaches the epitaxial structure with the gallium-based layer. The bonding layer and gallium-based layer are transparent for the light.

BRIEF DESCRIPTION OF THE DRAWINGS

FIG. 2 is flowchart of a process for manufacturing a μLED, in accordance with one embodiment.

DETAILED DESCRIPTION

Embodiments relate to manufacturing a LED, such as micro-LED, using a temporary lift-off substrate that is removed from an epitaxial structure using a laser-lift-off (LLO) process after processing the epitaxial structure into the LED on the lift-off substrate. The color of light emission or other properties of a LED may depend on the materials used in the epitaxial structure of the LED. Some materials that can be used for an epitaxial structure, such as GaAs for red color LEDs, are grown on growth substrates that are non-transparent for (e.g., ultraviolet) light used in the LLO process. To facilitate LLO processes, the epitaxial structure is separated from the non-transparent growth substrate at a first side and attached with a gallium-based layer and a lift-off substrate at a second side. While on the lift-off substrate, the LED is formed from the epitaxial structure. For example, a mesa and a base are etched into the epitaxial structure, a dielectric layer and a first contact (e.g., p-contact) are formed on the mesa, and a second contact (e.g., n-contact) is formed on the base. The lift-off substrate is then removed from the epitaxial structure using a LLO process that applies light through the lift-off substrate to melt a portion of the gallium-based layer into metallic gallium. The LLO process debonds the lift-off substrate and the gallium-based layer after formation of the LED, leaving the epitaxial structure and gallium-based layer on the LED.

The micro-LED, "μLED," "MicroLED," or "mLED," as described herein refers to a particular type of inorganic light emitting diode having a small active light emitting area.

Overview of Example Micro-LED

Figure 1:
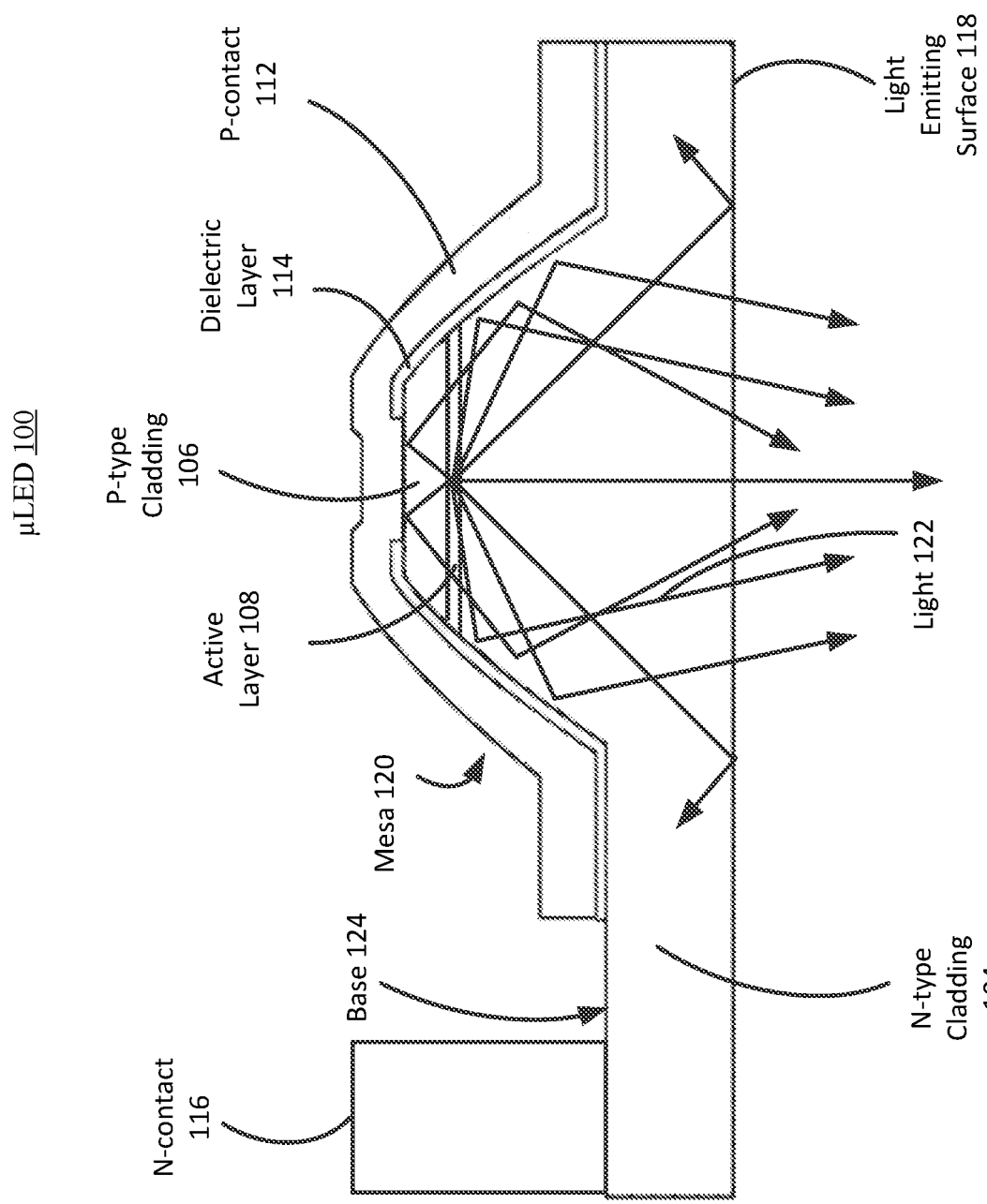
FIG. 1 is a cross-sectional diagram of a micro-LED (μLED), in accordance with one embodiment.

FIG. 1 is a schematic diagram of a cross section of a micro-LED 100 (hereinafter referred to as "μLED"), in accordance with one embodiment. The μLED 100 may include, among other components, an epitaxial structure including an n-type cladding 104, a p-type cladding 106, and an active layer 108 between the n-type cladding 104 and the p-type cladding 106. The μLED 100 further includes a dielectric layer 110 on the semiconductor structure, a p-contact 112 on the dielectric layer 114, and an n-contact 116 on the n-type cladding 104. The semiconductor structure is shaped, such as via an etch process, into a mesa 120 and a base 124 of the mesa 120. The p-type cladding 106 defines the top of the mesa 120, and the n-type cladding 104 defines a portion of the mesa 120 and the base 124. The p-type cladding 104 may be thinner than the n-type cladding 106. In some embodiments, an n-type cladding defines the top portion of the mesa 120 and a thicker p-type cladding defines the bottom portion of the mesa 120 and the base 124. Here, the p-contact 112 is an n-contact and the n-contact 116 is a p-contact.

The active layer 108 defines an active light emitting area that is included in the structure of the mesa 120. The mesa 120 may include a truncated top defined on a side opposed to a light emitting surface 118 of the μLED 100. In some embodiments, the epitaxial structure including the n-type cladding 104, active layer 108, and p-type cladding 106 are grown on a growth substrate. The active layer 108 may include 2D or 3D quantum structures, such as a single or multiple quantum wells, quantum dots, quantum wires, quantum dash structures, quantum pyramid structures, etc.

The mesa 120 may include various shapes, such as a parabolic shape with a truncated top, to form a reflective enclosure for light 122 generated within the μLED 100. In other embodiments, the mesa 120 may include a cylindrical shape with a truncated top, or a conic shape with a truncated top, or some other light-collimating shape. The arrows show how the light 122 emitted from the active layer 108 is reflected off the p-contact 112 and internal walls of the mesa 120 toward the light emitting surface 118 at an angle sufficient for the light to escape the micro-LED 100 (i.e., within a critical angle of total internal reflection). The p-contact 112 and the n-contact 116 electrically connect the μLED 100, such as to a display substrate including a control circuit for the μLED 100. The n-contact 116 is formed at the base 124, which is defined by a surface of the n-type cladding 106 opposite the light emitting surface 118. The n-contact 116 may include a conductive material that extends to the top of the mesa 120 to support the placement of the μLED on the display substrate with the p-contact 112 and the n-contact 116 bonded to the display substrate.

The μLED 100 may include an active light emitting area defined by the active layer 108. The μLED 100 directionalizes the light output from the active layer 108 and increases the brightness level of the light output. In particular, the p-contact 112 may be reflective for the light emitted from the active layer 108. The mesa 120 and p-contact 112 cause reflection of the light 122 from the active layer 108 to form a collimated or quasi-collimated light beam emerging from the light emitting surface 118.

In some embodiments, the p-contact 112 includes a contact (can be a single metal or a stack) located at the top of the mesa 120 directly on the p-type-cladding 106 and a thick metal (usually a stack but can be different from the contact stack) on the contact that acts as a mirror on the sidewalls and as bonding pad for the p-contact 112.

The mesa 120 may be formed by etching into a semiconductor structure, including the n-type cladding 104, the active layer 108, and the p-type cladding 106, during wafer processing steps. The etching results in the active layer 108 being in the structure of the mesa 120, and at a particular distance to the p-contact 112 to facilitate the collimation of the light 122. A portion of the generated light 122 is reflected at the mesa 120 to form the quasi-collimated light beam emitted from the light emitting surface 118.

In some embodiments, the feature size of the μLED 100 (e.g., the diameter) may range from sub-micrometers to tens of micrometers (e.g., from 0.1 μm to 10 μm). The μLED 100 may be one of many μLEDs of an array, with the pitch (e.g., spacing between μLEDs) ranging from sub-micrometers to tens of micrometers.

Example Process of Manufacturing μLED

FIG. 2 is a flowchart of a process 200 for manufacturing a μLED, in accordance with one embodiment. The process 200 may be performed to manufacture a μLED where the growth substrate is non-transparent for light used in a laser lift off (LLO) process, and is removed after formation of the epitaxial structure. The epitaxial structure is mounted to a gallium-based (e.g., gallium nitride (GaN)) layer that absorbs light used in the LLO process, and a lift-off substrate that is transparent for the light used in LLO process. The μLED is formed from the epitaxial structure on the lift-off substrate, such as etching of the mesa and formation of the contacts.

After forming the μLED, the lift-off substrate is separated from the epitaxial structure using a LLO process that applies light through the lift-off substrate to melt a portion of the gallium-based layer. The gallium-based layer is a semiconductor material including gallium, such as gallium nitride (GaN). In other embodiments, the gallium-based layer may include gallium arsenide (GaAs), gallium phosphide (GaP), or gallium-based alloys, such as Indium gallium nitride (InGaN) or aluminium gallium nitride (AlGaN). In some embodiments, a suitable material different the gallium-based layer may be used if the material is capable of dissociating under light exposure to facilitate the LLO process as discussed herein.

Some examples of non-transparent growth substrates include a gallium arsenide (GaAs) substrate for the red color LEDs, or a silicon (Si) substrate for gallium nitride (Gan)-on-Si based blue and green color LEDs. The process 200 is discussed with reference to FIGS. 3A, 3B, 3C, 3D, 3E, 3F, and 3G, which show manufacturing of μLEDs 380 from a semiconductor structure 300, in accordance with one embodiment. In some embodiments, the process 200 may include different and/or additional steps, or some steps may be in different orders.

Figure 3A:
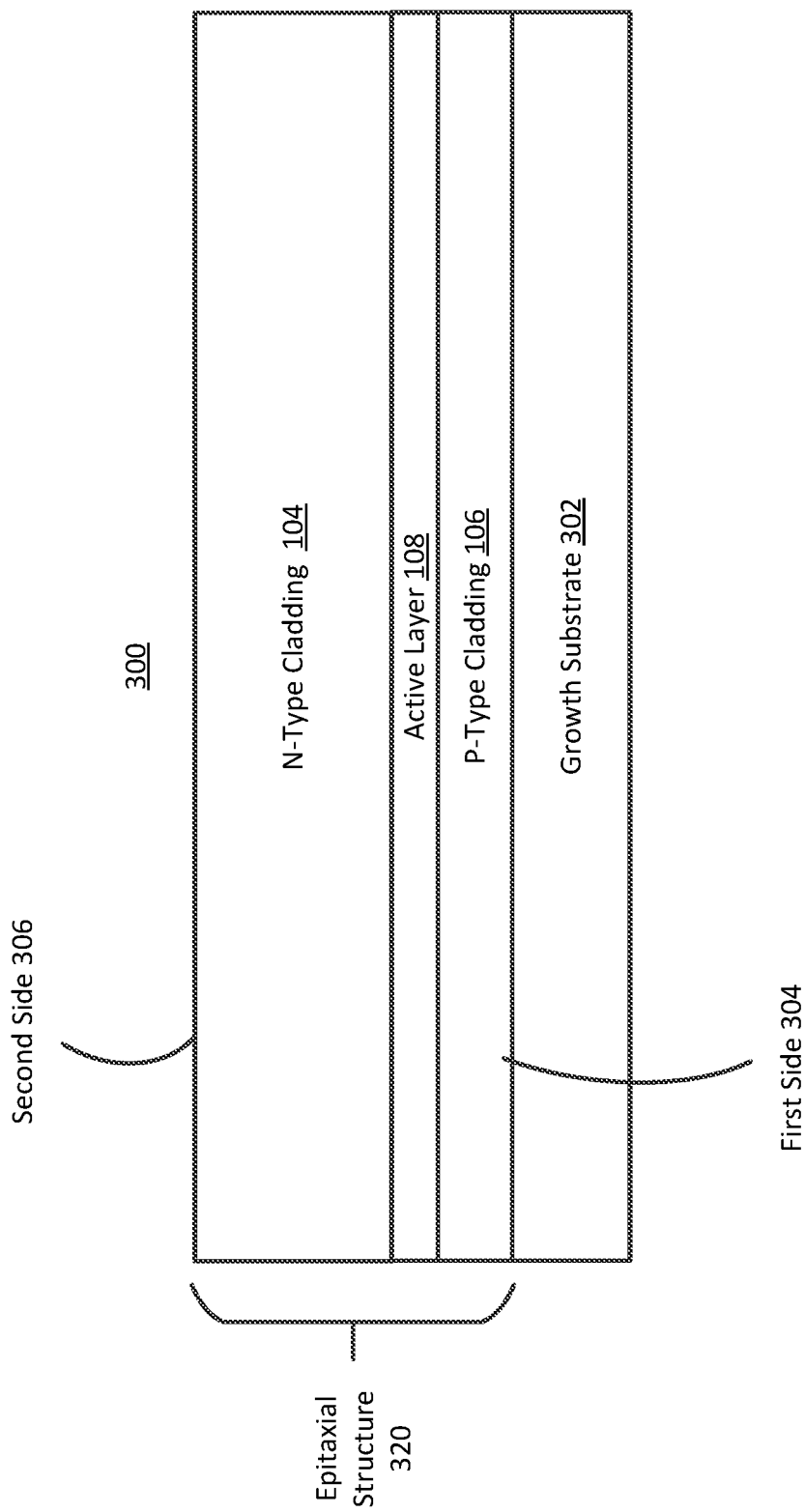
FIGS. 3A, 3B, 3C, 3D, 3E, 3F, and 3G show a semiconductor structure and a μLED manufactured from the semiconductor structure, in accordance with one embodiment.

An epitaxial structure of a LED, such as a μLED 100, is formed 205 on a growth substrate. FIG. 3A shows a cross section of the semiconductor structure 300 including the epitaxial structure 320 and a growth substrate 302, in accordance with one embodiment. The semiconductor structure 300 is an initial structure that is etched to form the mesa 120 of an LED such as the μLED 100. The semiconductor structure 300 includes the epitaxial structure 320, with a first side 304 of the epitaxial structure 320 facing the growth substrate 302. A second side 306 of the epitaxial structure 320 opposite the first side 304 forms the top of the epitaxial structure 320 and is exposed. When the epitaxial structure 320 is on the growth substrate 302, the second side 306 is defined above the first side 304.

The epitaxial structure 320 may include semiconductor layers grown on the growth substrate 302 from the first side 304 to the second side 306. The semiconductor layers include the p-type cladding 106 on the growth substrate 302, the active layer 108 on the p-type cladding 106, and the n-type cladding 104. The epitaxial structure 320 may be grown using techniques such as Molecular Beam Epitaxy (MBE) or Metalorganic Chemical Vapor Deposition (MOCVD). The p-type cladding 106 is thinner than the n-type cladding 104, as discussed above for the μLED 100.

The growth substrate 302 may be a non-transparent substrate for light used in a laser-lift off (LLO) process, such as GaAs, silicon (Si), or GaN for ultraviolet (UV) light. The n-type cladding 104 and p-type cladding 106 may be GaN-based heterostructure or a GaAs-based heterostructure. A GaAs-based heterostructure may be grown on a GaAs substrate, while a GaN-based heterostructure may be grown on a GaN substrate or Si substrate. The n-type cladding 104 includes the n-type layers of the epitaxial structure 320. The n-type cladding 104 may include, among other things, a confinement layer facing the active layer 108, and a current spreading layer on the confinement layer. The active layer 108 may include a multiple quantum wells. The p-type cladding 106 includes the p-type layers of the epitaxial structure 320. The p-type cladding 106 may include a contact layer on the growth substrate 302, and a confinement layer on the contact layer facing the active layer 108. The confinement layers of the n-type cladding 104 and p-type cladding 106 provides a barrier material for the active layer 108 to confine electrons in the active layer 108. The contact layer provides an interface to the p-contact 112 for the epitaxial structure 320.

Figure 3B:
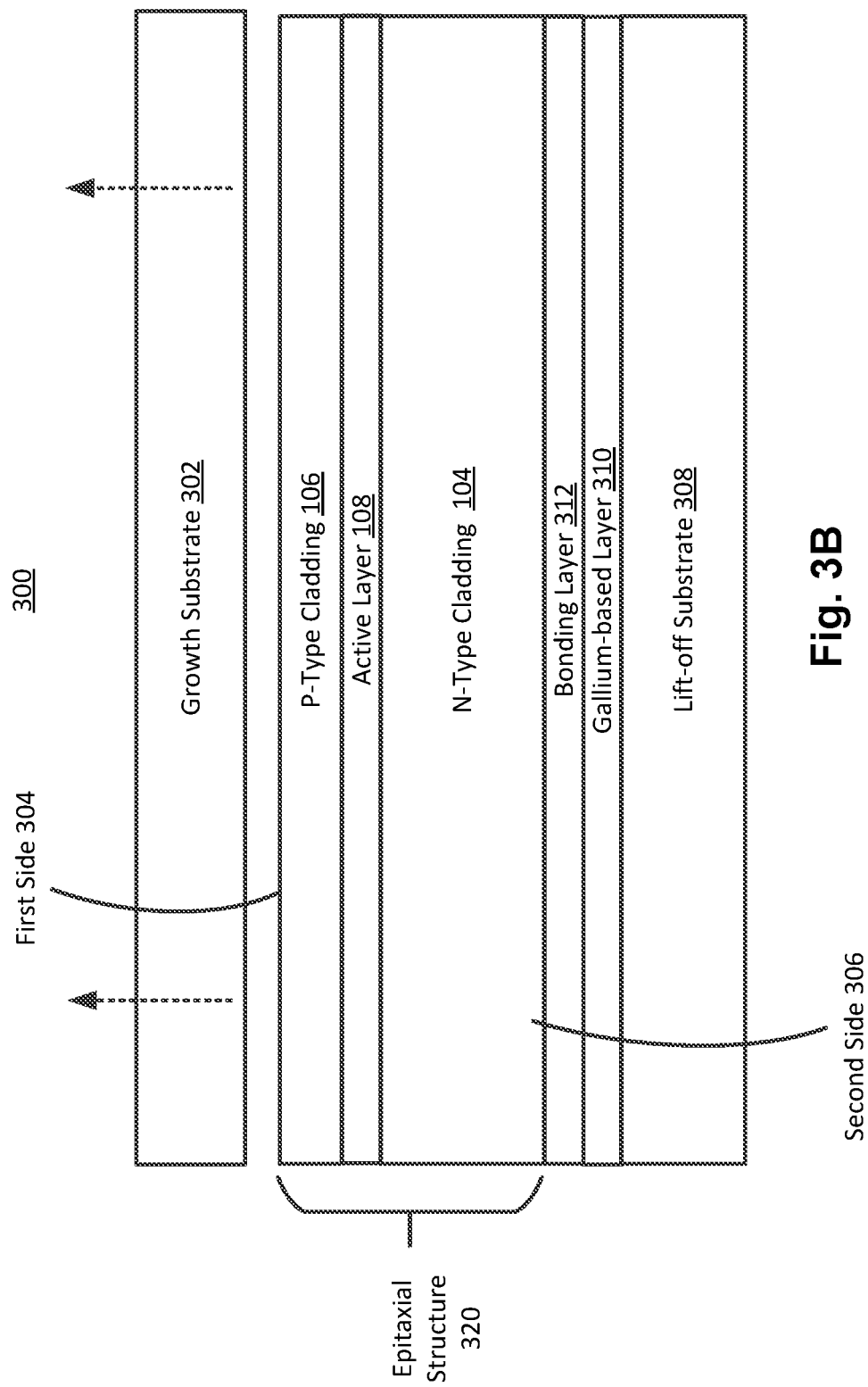

A gallium-based layer and a lift-off substrate are attached 210 with a side of the epitaxial structure opposite the growth substrate. FIG. 3B shows a cross section of the semiconductor structure 300 including the epitaxial structure 320 and a lift-off substrate 308, in accordance with one embodiment. The gallium-based layer 310 is formed on the lift-off substrate 308, and then bonded to the second side 306 of the epitaxial structure 320 via a bonding layer 312. The bonding layer 312 may be a thin oxide layer that is transparent for the light emitted from the LED. The gallium-based layer 310 may be an epitaxial layer that is grown on the lift-off substrate 308, or may be deposited on the lift-off substrate 308 using some other technique that provides a smooth surface. The gallium-based layer 310 is transparent for the light emitted from the LED, and absorbs the (e.g., UV) light used in the LLO process. The gallium-based layer 310 is thick enough to allow the LLO process to be executed but thin enough to have minimum impact on the light emitted from the LED. For example, the gallium-based layer 310 may have a thickness in the 100s of nanometers (nm) (e.g., 200 nm). The lift-off substrate 308 may be transparent to light used for LLO process, such as a sapphire substrate or a glass substrate for UV light, or a combination of UV-transparent layers.

The growth substrate 302 is separated 215 from the first side 304 of the epitaxial structure 320. The growth substrate 302 may be separated using a wet etching, a dry etching, or any other suitable technique. With reference to FIG. 3B, the epitaxial structure 320 is flipped such that the growth substrate 320 is above the epitaxial structure 320, the second side 306 of the epitaxial structure 320 is on the gallium-based layer 310 and the lift-off substrate 308, and the first side 304 at the top of the epitaxial structure 320 above the second side 306. The growth substrate 302 is then removed, with the first side 304 of the epitaxial structure 320 being exposed.

Figure 3C:
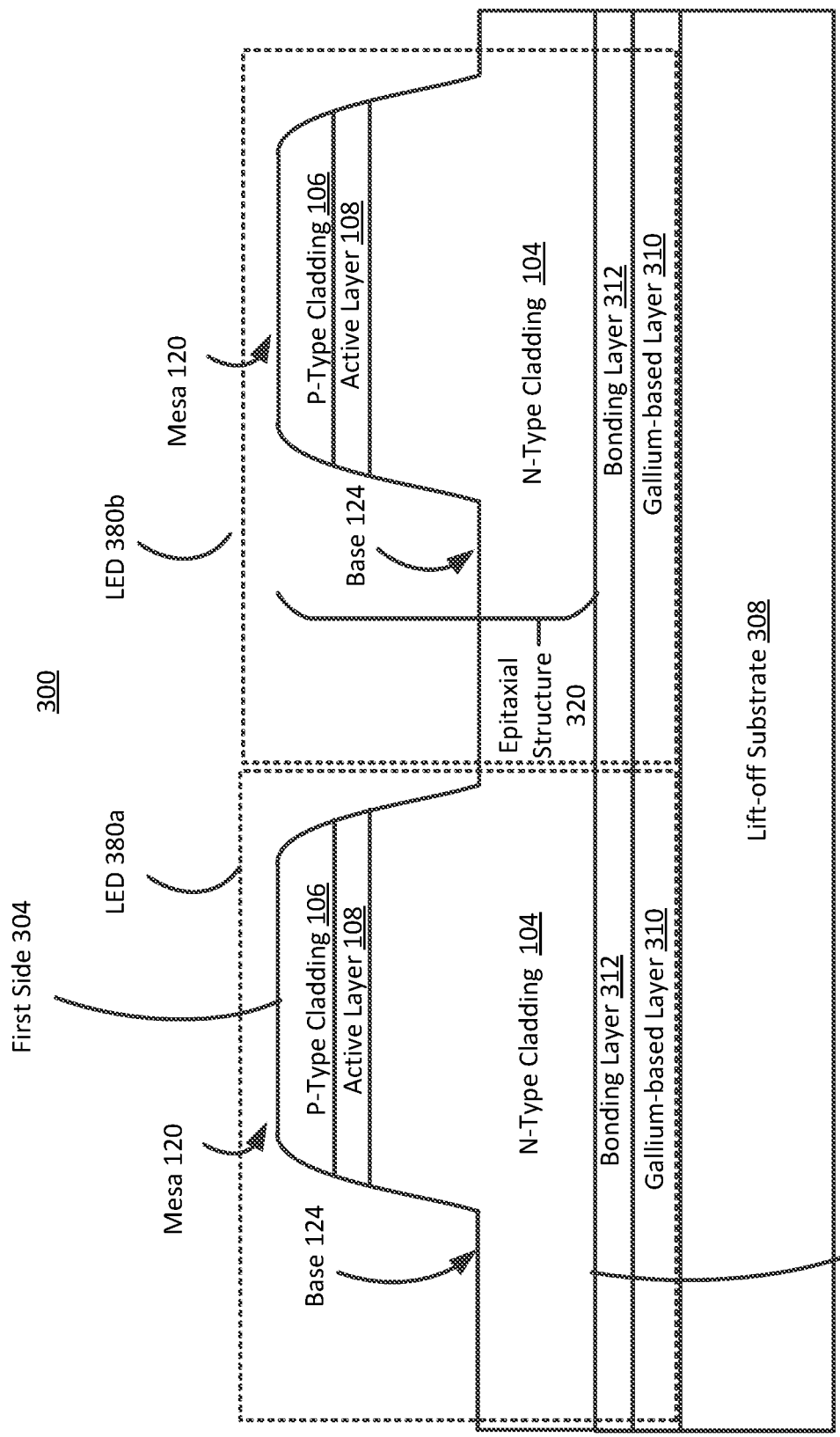

The epitaxial structure 320 is etched 220 from the first side 304 to form a mesa 120 and a base 124. FIG. 3C shows mesas 120 of LEDs 380a and 380b (also referred to as LED 380) formed in the semiconductor structure 300, according to one embodiment. One or more LEDs 380 may be formed from the epitaxial structure 320 of the semiconductor structure 300, such as an array of LEDs 380 including the LEDs 380a and 380b. A dry etching processes, such as an inductively coupled plasma (ICP) etch, may be used to form the mesa 120 and the base 124 of each LED 380 in the epitaxial structure 320. The mesa 120 includes the p-type cladding 106 at the top of the mesa, the active layer 108, and a portion of the n-type cladding 104. The base 124 at the bottom of the mesa 120 includes another (e.g., un-etched) portion of the n-type cladding 104. The ICP etch may be used to provide controllable isotropic or anisotropic etching by varying parameters to form the shape of the mesa 120 and the base 124, such as the parabolic, cylindrical, or conic shapes with truncated top. In some embodiments, the first side 304 defined by the p-type cladding 106 at is patterned using a positive photo-resist mask over a region of the epitaxial structure 320 to be formed into the mesa 120. The etch process is controlled to etch sloped side walls for the mesa 120 that define the shape of the mesa 120. For regions of the epitaxial structure 320 to be formed into the base 124, which are not protected by the photo-resist mask, the epitaxial structure 320 is etched from the p-type cladding 106, through the active layer 108, and through a portion of the n-type cladding 104. The lift-off substrate 308 serves as an intermediate carrier for the epitaxial structure 320 during the formation of the mesa 120 and base 124, as well as the formation of other features of the LEDs 380. Additional details regarding using an etching process to form a mesa in a semiconductor structure are discussed in U.S. Pat. No. 7,598,148, titled "Micro-leds," issued Oct. 6, 2009, which is incorporated by reference herein in its entirety. As discussed above, the steps in the process 200 may be different. For example, the lift-off layer 310 and lift-off substrate 308 may be attached to the epitaxial structure 320 after the growth substrate 302 is separated from the epitaxial structure 320.

Figure 3D:
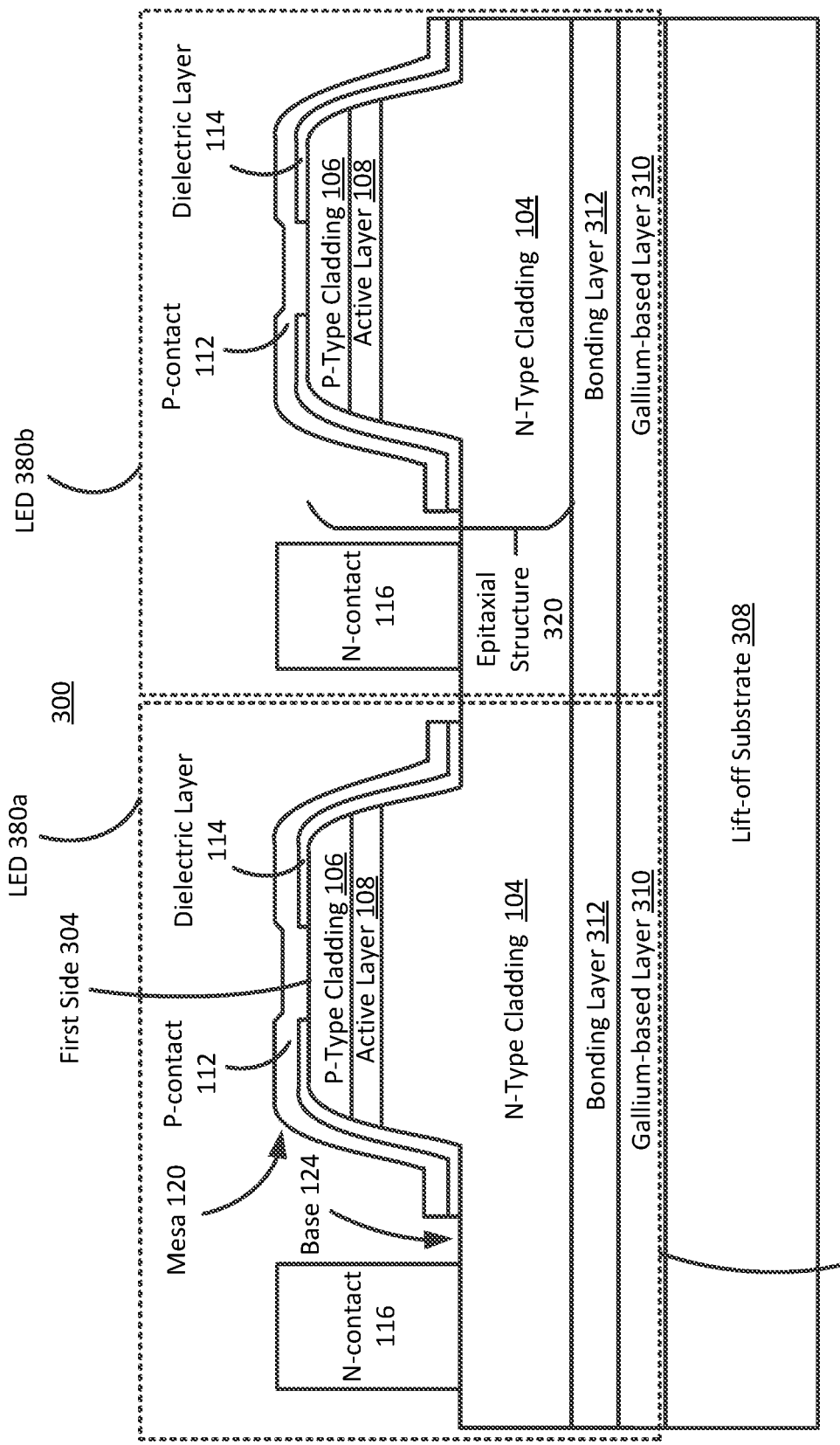

A dielectric layer 114 and a p-contact 112 is formed 225 on the mesa 120 and an n-contact 116 is formed 225 on the base 124. FIG. 3D shows the semiconductor structure 300 including LEDs 308a and 308b, in accordance with one embodiment. The dielectric layer 114 may be formed on the mesa 120 of each LED 380a and 380b. The p-contact 112 is formed on the dielectric layer 114, with a portion of the p-contact 112 extending through the dielectric layer 114 to contact the p-type cladding 106. The n-contact 116 is formed on the base 124 of the n-type cladding 104. The lift-off substrate 308 serves as an intermediate carrier for the epitaxial structure 320 during the formation of the dielectric layer 114, the p-contact 112, and the n-contact 116.

Figure 3E:
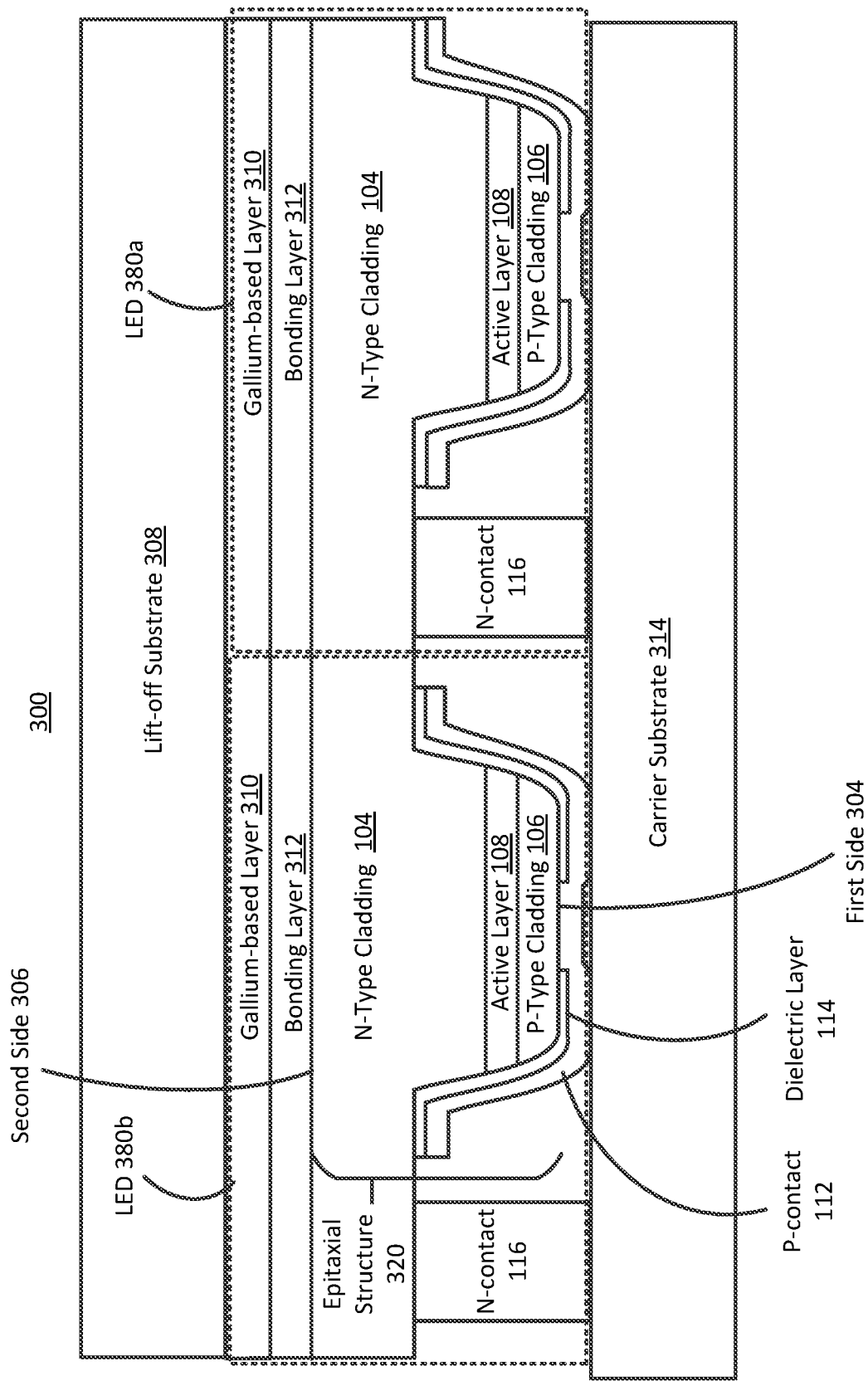

The p-contact 112 and the n-contact at the first side 304 of the epitaxial structure 320 are attached 230 with a carrier substrate. FIG. 3E shows the semiconductor structure 300 with the lift-off substrate 308 on the carrier substrate 314, in accordance with one embodiment. The first side 304 epitaxial structure 320 faces the carrier substrate 314, and the lift-off substrate is at the second side 306 of the epitaxial structure 320. In some embodiments, the carrier substrate 314 may include different materials than the lift-off substrate 308, such as materials with higher thermal properties, durability, etc. In other embodiments, the carrier substrate 314 may include the same materials as the lift-off substrate 308, such as glass, sapphire, etc.

Figure 3F:
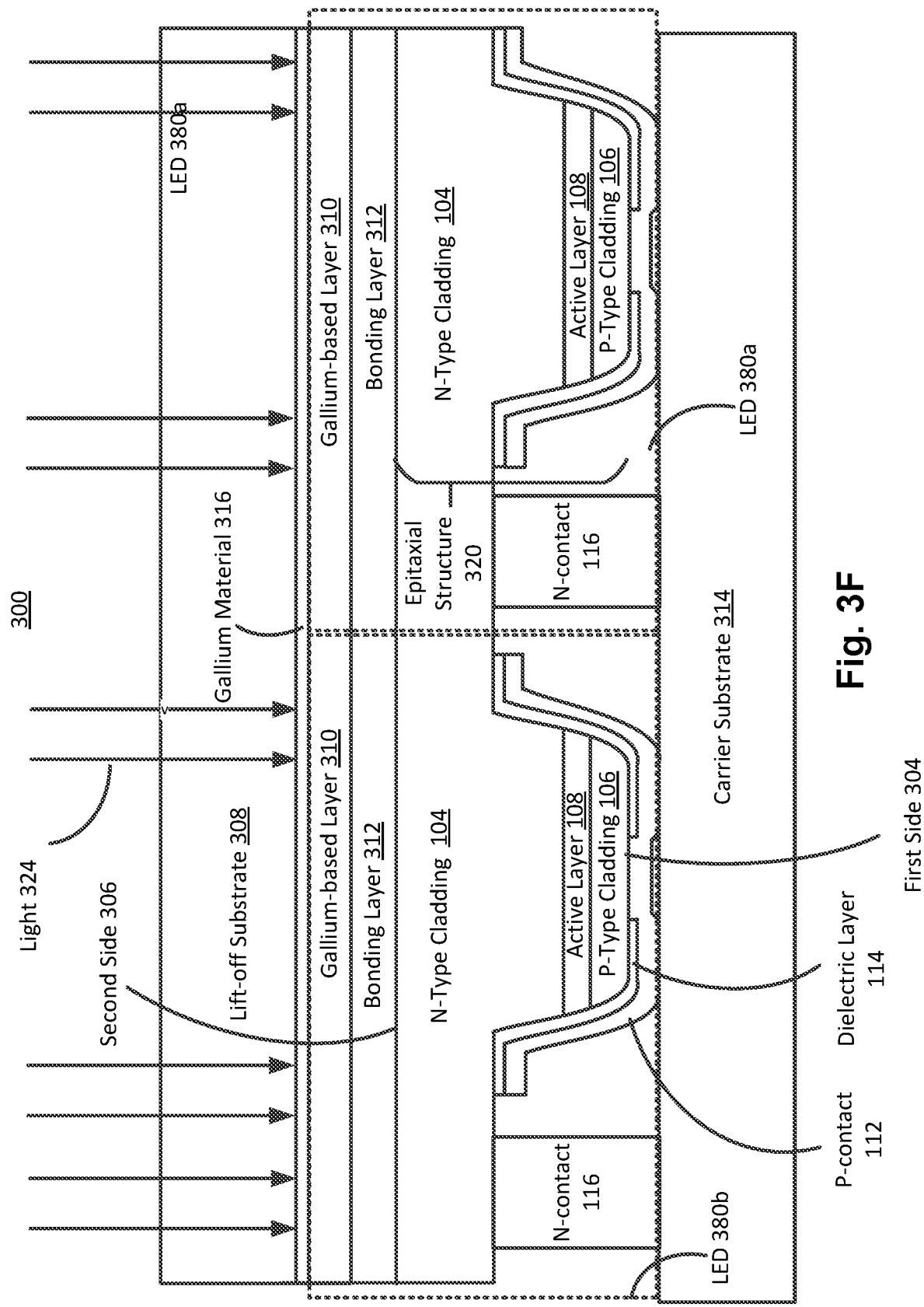

A light is applied 235 to the gallium-based layer 310 through the lift-off substrate 308 to form a gallium material between the gallium-based layer 310 and the lift-off substrate 308. The lift-off substrate 308 is removed using the LLO process. FIG. 3F shows the semiconductor structure 300 with light 324 applied to the gallium-based layer 310 through the lift-off substrate 308, in accordance with one embodiment. The light 324 may be a UV light that propagates through the transparent lift-off substrate 308, and is absorbed by the gallium-based layer 310. The UV light may be a laser light that is focused at the interface of the gallium-based layer 310 and lift-off substrate 308 by illuminating through the lift-off substrate 308. The laser light is absorbed over a thin thickness inducing a local melting of a portion of the gallium-based layer 310 into gallium (Ga) metal and a gas. In an example where the gallium-based layer 310 is GaN, the portion of the gallium-based layer 310 is separated into the gallium metal and nitrogen ($N_2$) gas. The gallium material 316 may include a thin layer of the gallium metal, and the nitrogen gas evaporates away from the semiconductor structure 300. As such, the LEDs 308, including the epitaxial structure 320, bonding layer 312, and the remaining portion of the gallium-based layer 310, are bonded on the lift-off substrate 308 by the gallium material 316.

The gallium material 316 is heated 240 to debond the gallium-based layer 310 and the lift-off substrate 308. The gallium material 316 melts at a low temperature, around 40 degrees Celsius, such that a slight heating (e.g., with the carrier substrate 314 on a hot plate) melts the gallium material 316, and allow the LEDs 308 to be released from the lift-off substrate 308.

Figure 3G:
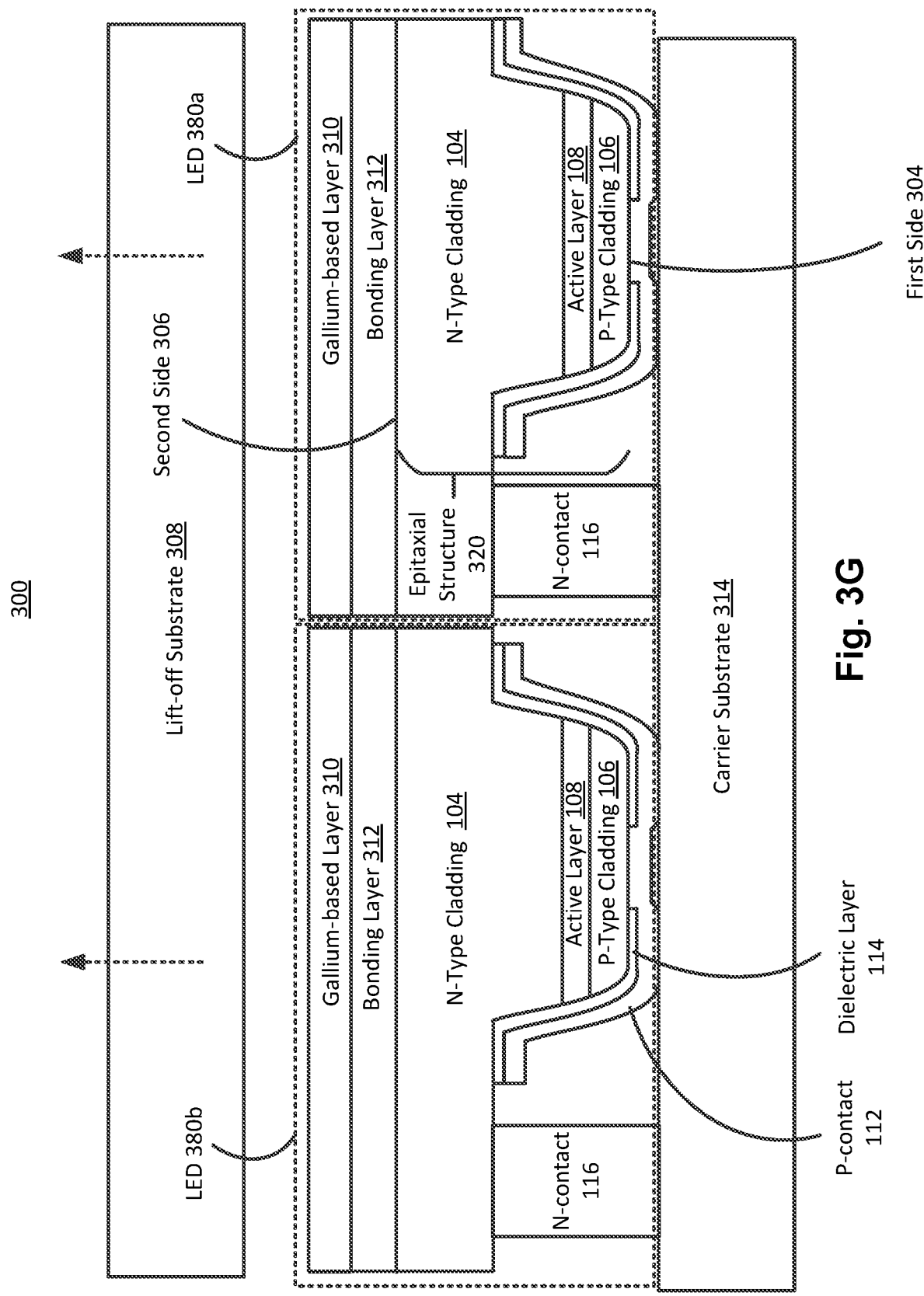

The lift-off substrate 308 is separated 245 from the gallium-based layer 310. FIG. 3G shows the semiconductor structure 300 separated from the lift-off substrate 308, in accordance with one embodiment. The debonded lift-off substrate 308 may be lifted away from the gallium-based layer 310, revealing the gallium-based layer 310. In some embodiments, residue of the gallium material 316 remaining on the gallium-based layer 310 may be removed, such as by a wet etching (e.g., with diluted HCl), or some other removal process. Thus, the gallium-based layer 310 and bonding layer 312 remains on the LEDs 380, and the lift-off substrate 308 and gallium material 316 are removed.

In some embodiments, the LEDs 380a and 380b are singulated on the carrier substrate 314, such as by ICP etching or a laser dicing, after removal of the lift-off substrate 308. In other embodiments, the LEDs 380a and 380b are singulated prior to removal of the lift-off substrate 308. The LEDs 380a and 380b are separated into individual dies that can be selectively picked up from the carrier substrate 314. In some embodiments, an adhesive layer between the LEDs 380 and the carrier substrate 314 is used to secure the LEDs 380 to the carrier substrate 314 during the laser-lift-off of the lift-off substrate 308. The adhesiveness of the adhesive layer may be locally weakened for individual LEDs, such as by a laser light, to facilitate selective pickup of some LEDs 380 from the carrier substrate 314 while keeping other LEDs 380 securely attached to the carrier substrate 314.

Figure 4:
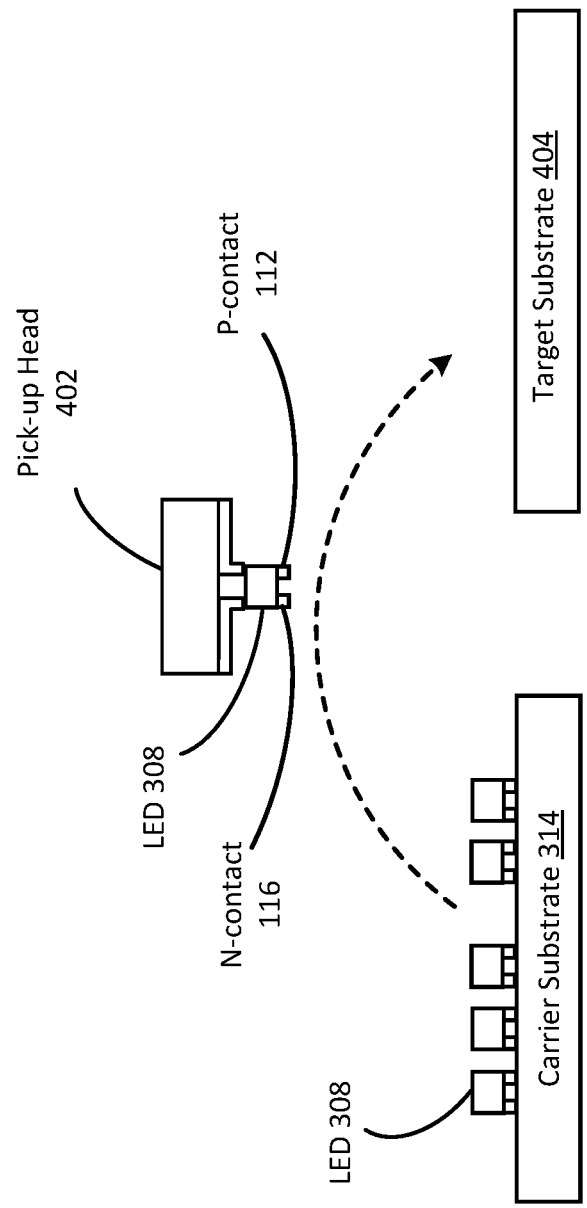
FIG. 4 is a schematic diagram of a display fabrication system for picking and placing of the μLED from a carrier substrate to a target substrate, in accordance with one embodiment.

The LED 380 is picked up 250 from the carrier substrate 314 and placed 250 on a target substrate. FIG. 4 is schematic diagram of a display fabrication system 400, in accordance with one embodiment. The display fabrication system 400 includes, among other things, a pick-up head 402, the carrier substrate 314 including LEDs 308, and a target substrate 404. The pick-up head 402 attaches with a LED 308 to pick up the LED 308, and place the LED 308 on the target substrate. The target substrate may be a display substrate of an electronic display. Each LED 308 forms a sub-pixel of the electronic display. The n-contact 116 and p-contact 112 of the LED 308 are placed on contacts on the target substrate 404 to connect the LED 308 to a control circuit in the target substrate 404. In some embodiments, the gallium-based layer 310 of the LED 308 is coated with an elastomeric layer to facilitate adhesive attachment with the pick-up head 402. In some embodiments, the pick-up head 402 is part of an array of pick-up heads that can selectively pick up multiple LEDs 308 from the carrier substrate 314 and place the selected LEDs 308 onto the display substrate in a single pick and place cycle. The LEDs 308a and 308b that are formed from the same epitaxial structure 320 may be LEDs of a common color, such as red color LEDs. Arrays of green and blue LEDs may be formed on carrier substrates, and picked up from their carrier substrates and placed onto the target substrate 404 as discussed herein for the LEDs 308a on the carrier substrate 314.

In some embodiments, rather than attaching the contacts of the epitaxial structure 320 with the carrier substrate at 230 and using a pick and place process at 250, the contacts of the epitaxial structure 320 are directly attached to the target substrate. Then the LLO process is used to separate the lift-off substrate from the gallium-based layer.

Figure 5:
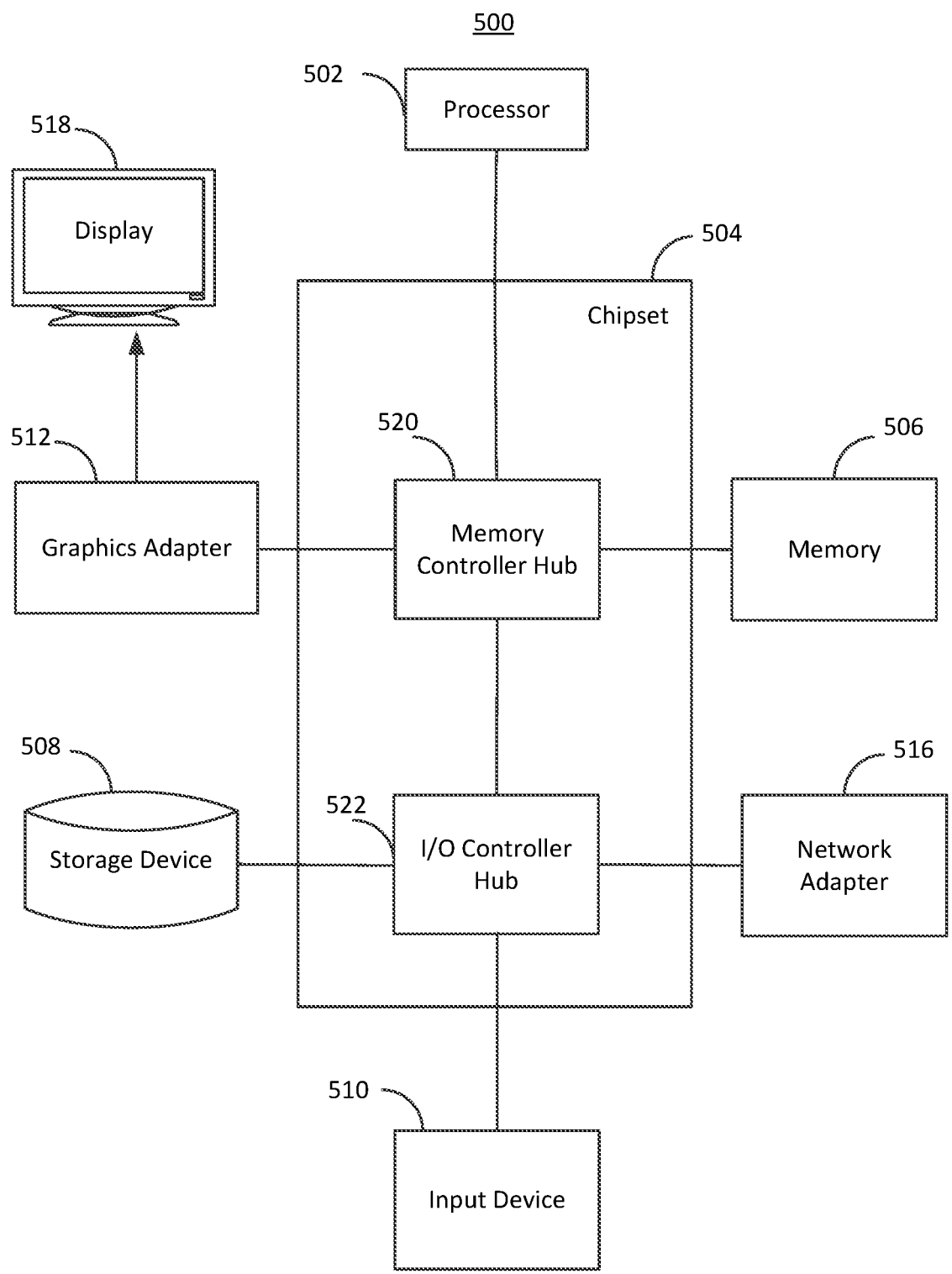
FIG. 5 is a high-level block diagram illustrating an example of a computer for use in a display fabrication system, in accordance with one embodiment.

FIG. 5 is a high-level block diagram illustrating an example of a computer 500 for use in a display fabrication system, in accordance with one embodiment. The computer 500 may be configured to control components of a display fabrication system to cause the display fabrication system to manufacture light emitting diodes and electronic displays as discussed above in connection with the process 200 and FIG. 2. The computer 500 includes at least one processor 502 coupled to a chipset 504. The chipset 504 includes a memory controller hub 520 and an input/output (I/O) controller hub 522. A memory 506 and a graphics adapter 512 are coupled to the memory controller hub 520, and a display device 518 is coupled to the graphics adapter 512. A storage device 508, input device 510, and network adapter 516 are coupled to the I/O controller hub 522. Other embodiments of the computer 500 have different architectures. For example, the memory 506 is directly coupled to the processor 502 in some embodiments.

The storage device 508 includes one or more non-transitory computer-readable storage media such as a hard drive, compact disk read-only memory (CD-ROM), DVD, or a solid-state memory device. The memory 506 holds instructions and data used by the processor 502. For example, the process 200 discussed above may be implemented using computer-readable instructions stored in the memory 506 that is executed by the processor 502 of the manufacturing system. In another example, the process 200 may be implemented using other types of circuitry, such as an application-specific integrated circuit (ASIC), field-programmable gate array (FPGA), etc.

The input device 510 is used to input data into the computer system 500, and may include a touch screen, keyboard, mouse, controller, imaging device, etc. The graphics adapter 512 displays images and other information on the display device 518. In some embodiments, the display device 518 includes integrated touch screen capability for receiving user input and selections. The network adapter 516 couples the computer system 500 to a network. Some embodiments of the computer 500 have different and/or other components than those shown in FIG. 5. The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:
1. A method, comprising:
  forming an epitaxial structure of a light emitting diode (LED) on a growth substrate, a first side of the epitaxial structure facing the growth substrate;

attaching a second side of the epitaxial structure opposite the first side with a gallium-based layer and a lift-off substrate, the gallium-based layer between the epitaxial structure and the lift-off substrate;

separating the growth substrate from the first side of the epitaxial structure;

applying light to the gallium-based layer through the lift-off substrate to form a gallium material from a first portion of the gallium-based layer, the formed gallium material being between a second portion of the gallium-based layer and the lift-off substrate;

heating the gallium material to debond the second portion of the gallium-based layer and the lift-off substrate; and separating the lift-off substrate from the second portion of the gallium-based layer to expose a light emitting surface of the LED on the second portion of the gallium-based layer.

2. The method of claim 1, wherein forming the epitaxial structure includes:

forming a first cladding on the growth substrate;

forming an active layer on the first cladding; and forming a second cladding on the active layer, the first cladding being oppositely doped to the second cladding.

3. The method of claim 1, wherein the growth substrate is non-transparent for the light and the lift-off substrate is transparent for the light.

4. The method of claim 3, wherein:

the light includes ultraviolet (UV) light;

the growth substrate includes a gallium arsenide (GaAs) substrate or a silicon substrate; and the lift-off substrate includes a sapphire substrate, a glass substrate, or multiple UV-transparent layers.

5. The method of claim 1, wherein attaching the second side of the epitaxial structure with the gallium-based layer and a lift-off substrate includes:

forming the gallium-based layer on the lift-off substrate; and attaching the second side of the epitaxial structure with the gallium-based layer using a bonding layer.

6. The method of claim 5, wherein the bonding layer and the gallium-based layer is transparent for light emitted from the epitaxial structure.

7. The method of claim 6, wherein the bonding layer includes an oxide.

8. The method of claim 1, further comprising, subsequent to separating the growth substrate from the first side of the epitaxial structure:

etching the epitaxial structure from the first side to form a mesa and a base;

forming a dielectric layer and a first contact on the mesa; and forming a second contact on the base.

9. The method of claim 8, further comprising, subsequent to forming the first contact and the second contact, attaching the epitaxial structure with the carrier substrate, the first contact and the second contact at the first side of the epitaxial structure facing the carrier substrate.

10. The method of claim 9, wherein the light is applied to the gallium-based layer, the gallium material is heated, and the lift-off substrate is separated from the second portion of the gallium-based layer while the epitaxial structure is attached with the carrier substrate.

11. The method of claim 1, wherein the gallium-based layer includes gallium nitride (GaN).

12. The method of claim 1, wherein the LED is a micro-LED.

13. The method of claim 1, further comprising placing the LED including the epitaxial structure and the second portion of the gallium-based layer on a display substrate of the electronic display.

* * * * *